United States Patent
Hsieh et al.

(10) Patent No.: US 10,170,554 B2
(45) Date of Patent: Jan. 1, 2019

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Wen-Jia Hsieh, Changhua County (TW); Hsin-Hung Chen, Tainan (TW); Yi-Chun Lo, Hsinchu County (TW); Jung-You Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 155 days.

(21) Appl. No.: 14/583,444

(22) Filed: Dec. 26, 2014

(65) Prior Publication Data

US 2016/0190249 A1 Jun. 30, 2016

(51) Int. Cl.
| | |
|---|---|
| H01L 21/336 | (2006.01) |
| H01L 29/08 | (2006.01) |
| H01L 27/092 | (2006.01) |
| H01L 29/78 | (2006.01) |
| H01L 29/66 | (2006.01) |
| H01L 21/02 | (2006.01) |
| H01L 29/165 | (2006.01) |
| H01L 21/8238 | (2006.01) |

(52) U.S. Cl.
CPC ...... *H01L 29/0847* (2013.01); *H01L 21/0245* (2013.01); *H01L 21/0262* (2013.01); *H01L 21/02532* (2013.01); *H01L 21/02576* (2013.01); *H01L 21/823814* (2013.01); *H01L 27/092* (2013.01); *H01L 29/165* (2013.01); *H01L 29/66628* (2013.01); *H01L 29/66636* (2013.01); *H01L 29/7834* (2013.01); *H01L 29/7848* (2013.01); *H01L 21/823807* (2013.01)

(58) Field of Classification Search
CPC ......... H01L 21/02532; H01L 21/02579; H01L 21/0262; H01L 29/0692; H01L 29/7834; H01L 29/7848; H01L 29/165; H01L 29/66636; H01L 21/336; H01L 21/20
See application file for complete search history.

(56) References Cited

U.S. PATENT DOCUMENTS

| | | | | |
|---|---|---|---|---|
| 2007/0018236 A1* | 1/2007 | Tsuchiaki | ............ | H01L 29/0653 257/324 |
| 2011/0147828 A1* | 6/2011 | Murthy | ............. | H01L 21/02057 257/327 |
| 2012/0273886 A1* | 11/2012 | Zhong | ............... | H01L 29/66636 257/347 |
| 2012/0319203 A1* | 12/2012 | Cheng | ............... | H01L 29/66666 257/346 |

(Continued)

*Primary Examiner* — Charles D Garber
*Assistant Examiner* — Abdulfattah Mustapha
(74) *Attorney, Agent, or Firm* — WPAT, P.C., Intellectual Property Attorneys; Anthony King

(57) ABSTRACT

A semiconductor device includes: a gate structure on a substrate; a raised source/drain region adjacent to the gate structure; a channel region under the gate structure; and a protection layer between the substrate and the raised source/drain region. The protection layer is interposed between the substrate and the raised source/drain region. An atom stacking arrangement of the protection layer is different from the substrate and the raised source/drain region.

17 Claims, 13 Drawing Sheets

(56) References Cited

U.S. PATENT DOCUMENTS

| | | | |
|---|---|---|---|
| 2013/0109144 A1* | 5/2013 | Kim | H01L 21/02532 438/301 |
| 2013/0299910 A1* | 11/2013 | Cheng | H01L 21/823807 257/368 |
| 2014/0353714 A1* | 12/2014 | Loubet | H01L 29/7848 257/190 |

* cited by examiner

SEMICONDUCTOR DEVICE AND MANUFACTURING METHOD THEREOF

FIELD

The present disclosure relates to a semiconductor device and in particular, to a semiconductor device with a protection layer and a method of manufacturing the semiconductor device.

BACKGROUND

A significant trend throughout integrated circuit (IC) development is the downsizing of IC components. As the size reduces, the performance requirements become more stringent. Also, as devices continue to shrink in size, the channel region continues to shrink as well. For metal-oxide-semiconductor field effect transistors (MOSFETs), increased performance requirements have generally been met by aggressively scaling the length of the channel region. However, such a short channel length faces high electric field and manufacturing limits.

Epitaxial SiGe regions or other epitaxial source/drain regions improve transistor performance by increasing the mobility of the carriers in the channel region of the PMOS or NMOS transistors which result from the intentionally created lattice mismatch that induces mechanical stress or strain across the channel region. For example, a compressively-strained channel provides an improved hole mobility that is beneficial for PMOS transistors by increasing the PMOS drive current. However, during the epitaxial growth, the etchant gases or corrosive gases easily penetrate into the substrate, thus altering a profile of the source/drain region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
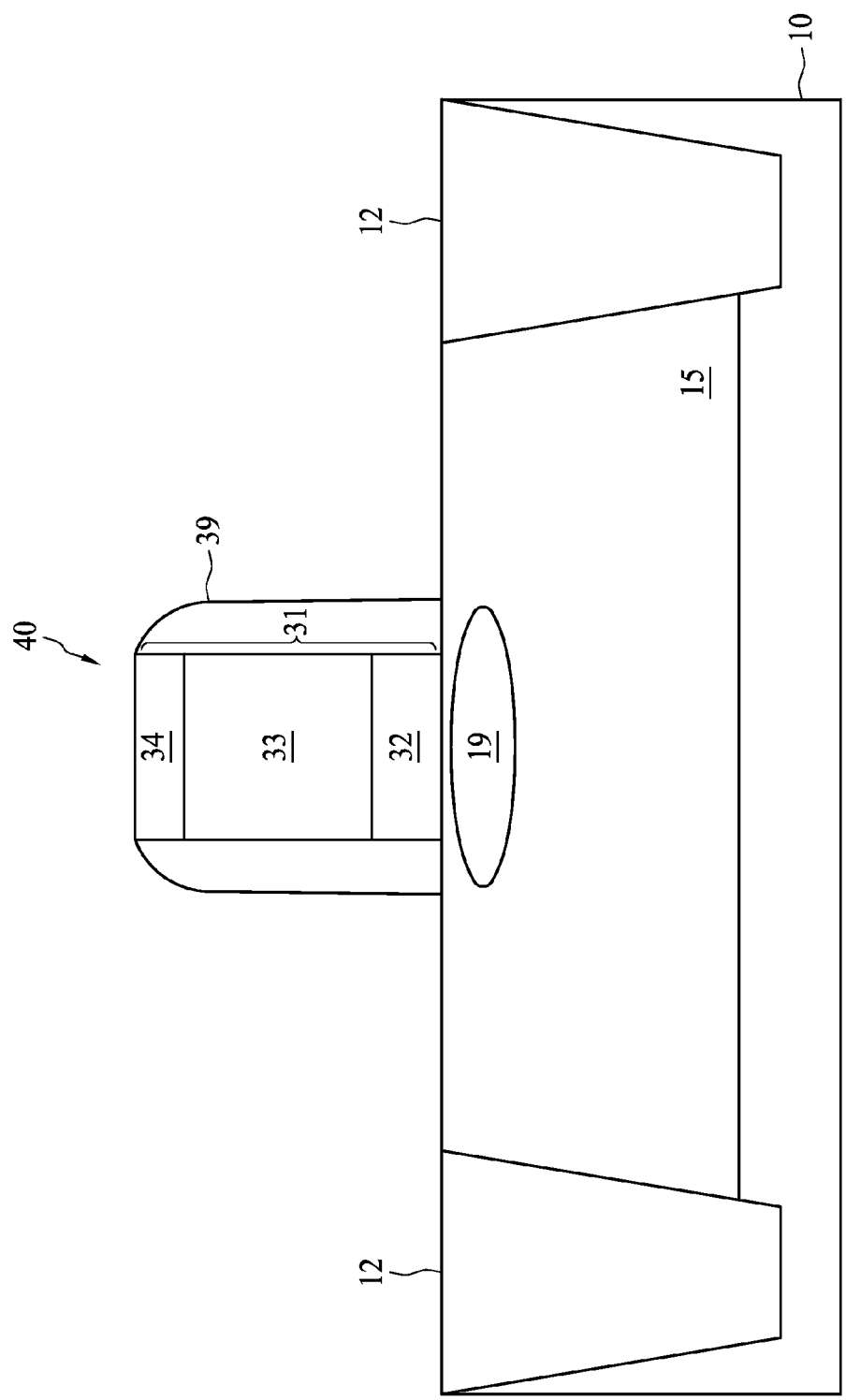
FIGS. 1A-1D represent a method of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

IC manufacturers have made great effort to improve the performance of NMOS and PMOS transistors. One technique for improving performance is to reduce the channel length of the transistors. However, reduction of the physical size of the transistor has faced a physical and electrical limitation due to manufacturing tools and techniques. Thus, IC manufacturers have turned to develop other techniques to improve the performance of NMOS and PMOS transistors. Another technique used to improve device performance is to establish certain strain in the channel region of the transistors. One or more layers of strain material, such as silicon carbide or silicon germanium, are formed adjacent to the channel region so as to induce strain in the channel region of the transistor. In NMOS transistors, it is designed to create a tensile stress in the channel regions so as to increase the mobility of carriers. In contrast, it is designed to create a compressive stress in the channel regions of the PMOS transistors. Thus, the stress in the channel region improves the switching speed and drive current.

In order to induce the stress to channel regions, the source/drain regions are made of strain materials such as SiC, SiP or SiGe. Cavities are formed adjacent to the gate structure prior to the source/drain deposition. Later, the source/drain regions are epitaxially grown layer by layer within the cavities. However, it is found that surfaces of the cavities have pit holes, dislocations or dangling bonds due to previous processes, for example, an etching process, an extra implantation or a doping process. Specifically, these previous processes damage the surfaces of the cavities. During the source/drain deposition, since the source/drain deposition includes corrosive gases or etchant gases, atoms of the etchant gases easily penetrate into the substrate through the pit holes or dislocations. The penetration of etchant gases results in a formation of the source/drain materials at unintentional locations. Profiles of the source/drain regions are altered and different from predetermined profiles. The altered source/drain regions cause low yield and downgraded electrical performance. In the present disclosure, a semiconductor device is fabricated to include a protection layer lining the cavities in order to block the etchant gases or corrosive gases during the source/drain deposition.

FIGS. 1A-1D represent a method of manufacturing a semiconductor device in accordance with some embodiments of the present disclosure. Each figure represents a stage of the method in a cross-sectional perspective view.

Referring to FIG. 1A, a substrate 10 is provided, wherein the substrate 10 has isolations 12. The substrate 10 is a silicon substrate or made of materials other than silicon, for example, silicon germanium, silicon carbide, germanium, III-V compound semiconductors. In an embodiment, the substrate 10 is made of a silicon-on-insulator (SOI) substrate. The SOI substrate includes a bulk silicon layer, a buried insulation layer and an active layer, wherein semiconductor devices are formed in and above the active layer. The isolations 12 are formed in the substrate 10 to define active regions of each device. In addition, the isolations 12 are configured to isolate various devices from one another. The isolations 12 are made of dielectric materials, such as oxide or nitride, by using local oxidation of silicon (LOCOS) or shallow trench isolation (STI). For example, during formation of the isolations 12, a pad layer and a stop layer (not shown) are formed over the substrate 10. The pad layer primarily serves as a stress buffer layer between the substrate 10 and following layers. The stop layer serves as a protection layer when polishing. By etching through the pad layer and the stop layer, the substrate 10 is then etched to form a plurality of shallow trenches. Later, the shallow trenches are filled with dielectric materials. A polishing process is then performed to planarize top surfaces of the dielectric materials, thus forming the isolations 12. Those skilled in the art shall understand the various steps used to form the isolations 12.

After forming the isolations 12, an implantation or a diffusion process (not shown) is performed on the substrate 10 to form a doped well 15 between the isolations 12. The doped well 15 includes a p-type dopant or an n-type dopant. In an embodiment, the device is implemented as a p-type MOSFET, wherein the doped well 15 is an n-type well with a lower dopant concentration than subsequent source/drain regions. Thus, the doped well 15 includes dopants, for example, phosphorous, arsenic, and/or antimony. In an embodiment, the device is implemented as an n-type MOSFET, wherein the doped well 15 is a p-type well with a lower dopant concentration than subsequent source/drain regions. Thus, the doped well 15 includes dopants, for example, boron, germanium, and/or indium.

Later, a gate dielectric layer, a gate electrode layer and a hard mask layer are deposited by using methods such as CVD, PVD, or ALD and then patterned to form a stack 31. The stack 31 includes a gate dielectric 32, a gate electrode 33 and a hard mask 34. The gate dielectric 32 is located on the substrate 10. In some embodiments, the gate dielectric 32 is made of silicon dioxide or a high dielectric constant (K) material. In some embodiments, the gate dielectric 32 includes a dielectric material based on silicon oxide, e.g., silicon oxynitride or a stack of at least one silicon oxide and at least one silicon nitride. In some embodiments, the gate dielectric 32 includes a dielectric metal oxide having a dielectric constant greater than 8.0, which is known as a high-k dielectric material. Exemplary high-k dielectric materials include $HfO_2$, $ZrO_2$, $La_2O_3$, $Al_2O_3$, $TiO_2$, $SrTiO_3$, $LaAlO_3$, $HfO_xN_y$, $Y_2O_3$, $LaAlO_xN_y$, $Al_2O_xN_y$, $ZrO_xN_y$, $La_2O_xN_y$, $TiO_xN_y$, $SrTiO_xN_y$, $Y_2O_xN_y$, and an alloy thereof. Each value of x is independently from 0.1 to 3.0 and each value of y is independently from 0.1 to 2.0.

The gate electrode 33 is located on the gate dielectric 32. In some embodiments, the gate electrode 33 includes standard polysilicon with doping, which refers to a poly-gate. Alternatively, the gate electrode 33 includes amorphous silicon material, a metal material, silicide metal material, or a stack of at least one metallic material and at least one semiconductor material. The gate electrode 33 serves as gate terminals in order to control a channel region 19. The material is chosen to meet the requirement of resistance.

The hard mask 34 is located on the gate electrode 33. In one embodiment, the hard mask 34 includes silicon oxide. In another embodiment, the hard mask 34 includes silicon nitride (SiN), silicon oxynitride (SiON), silicon carbide (SiC), SiOC, spin-on glass (SOG), a low-k film, plasma enhanced CVD oxide (PE-oxide), other suitable materials, and/or combinations thereof. The hard mask 34 includes an appropriate thickness to prevent the gate electrode 33 from being implanted during a subsequent implantation process for lightly doped drains (LDD) or a pocket.

Next, a conformal layer of gate sidewall material is deposited on the stack 31 in a blanketed fashion by using a CVD process with an appropriate thickness. Thereafter, the conformal layer of gate sidewall material is subjected to an anisotropic etch, thus resulting in a sidewall spacer 39. The sidewall spacer 39 is conformally formed on opposite sides of the stack 31, wherein the sidewall spacer 39 interfaces sidewalls of the stack 31 and the substrate 10. The sidewall spacer 39 includes silicon nitride, silicon dioxide, silicon carbide, silicon oxy-nitride, and/or another suitable dielectric material. After forming the sidewall spacer 39, a gate structure 40 including the stack 31 and the sidewall spacer 39 is formed on the substrate 10.

After forming the gate structure 40, a channel region 19 is located under the gate structure 40. In an embodiment, the channel region 19 is n-type and includes dopants, for example, phosphorous, arsenic, and/or antimony. In an embodiment, the channel region 19 is p-type and includes dopants, for example, boron, germanium, and/or indium. Since the doped well 15 is a foundation for manufacturing devices, the channel region 19 obtains features of the doped well 15. As such, the channel region 19 includes a dopant material that is the same as that of the doped well 15.

Figure 1B:
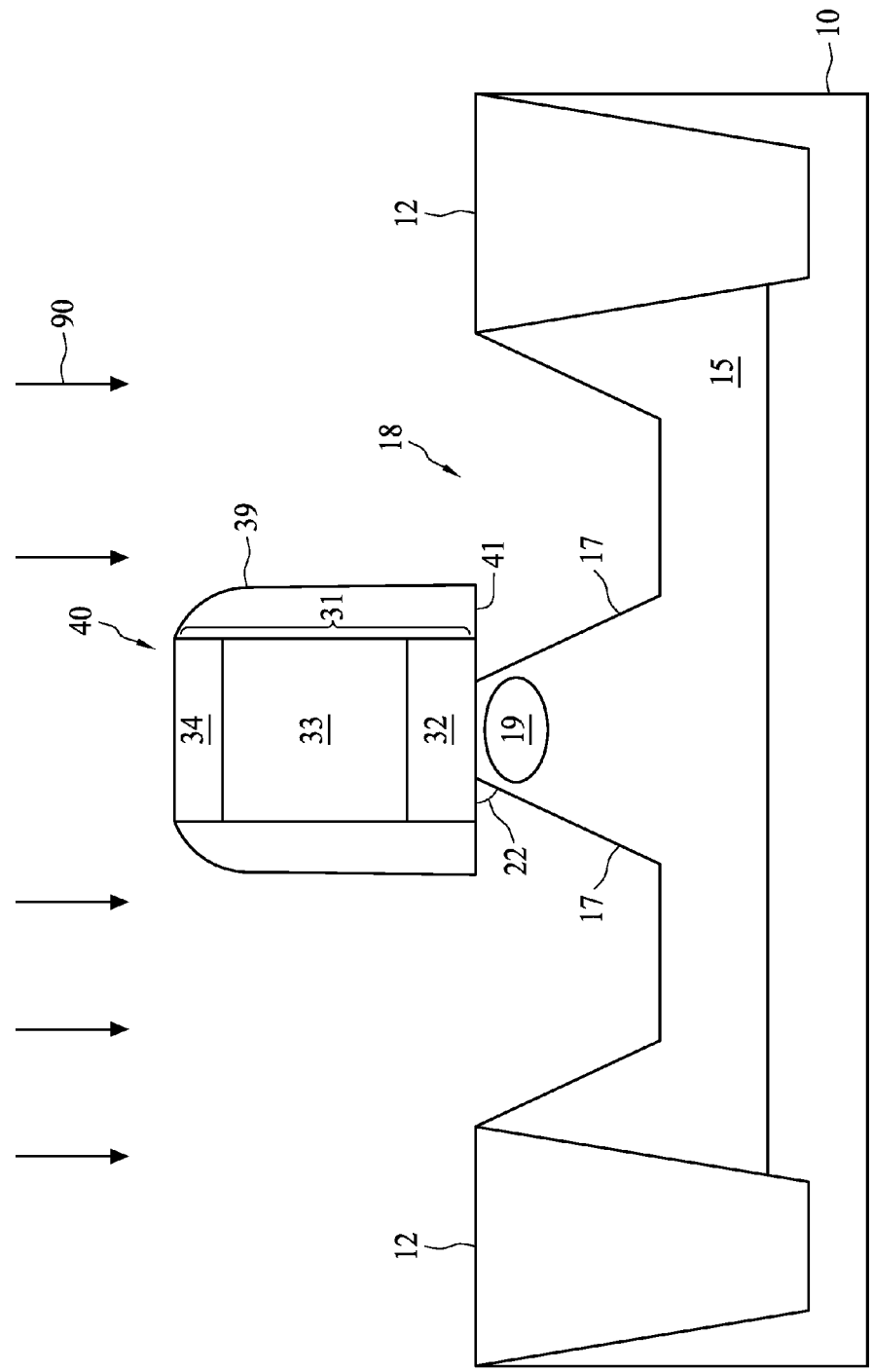

Referring to FIG. 1B, a cavity 18 is formed in the substrate 10 and adjacent to the gate structure 40 by using an etch process 90, wherein the gate structure 40 serves as a mask. Specifically, the hard mask 34 and the sidewall spacer 39 protect the channel region 19 and the gate electrode 33. The cavity 18 is vertically formed into the substrate 10 with a depth, for example, between about 10 nm and about 80 nm. It is also within the scope of the disclosure to etch the cavity 18 to any suitable depth. The cavity 18 thus exposes a surface 17, wherein the surface 17 extends from a bottom portion 41 of the gate structure 40 to the isolations 12. The surface 17 includes a U-shaped profile, a polygon profile or a rounded profile. The cavity 18 further includes a corner 22 under the gate structure 40, wherein the corner 22 exposes the bottom portion 41. In an embodiment, the etching process 90 is a wet etching with an isotropic feature that undercuts a portion of the substrate 10 under the gate structure 40. The semiconductor material under the gate structure 40 is encroached so as to form the corner 22 between the bottom portion 41 and the surface 17. In an embodiment, the etch process 90 utilizes a dry etching process with an anisotropy feature or an isotropy feature, for example, a reactive ion etches (RIE). The etch process 90 includes a molecule, which is ionized and reacts with materials of the substrate 10, but not the gate structure 40. Further, the etch process 90 includes a molecule such as $Cl_2$, $SF_6$, $N_2$, $CF_4$, $CHF_3$, $CH_2F_2$, $N_2H_2$, $O_2$, He or Ar.

Figure 1C:
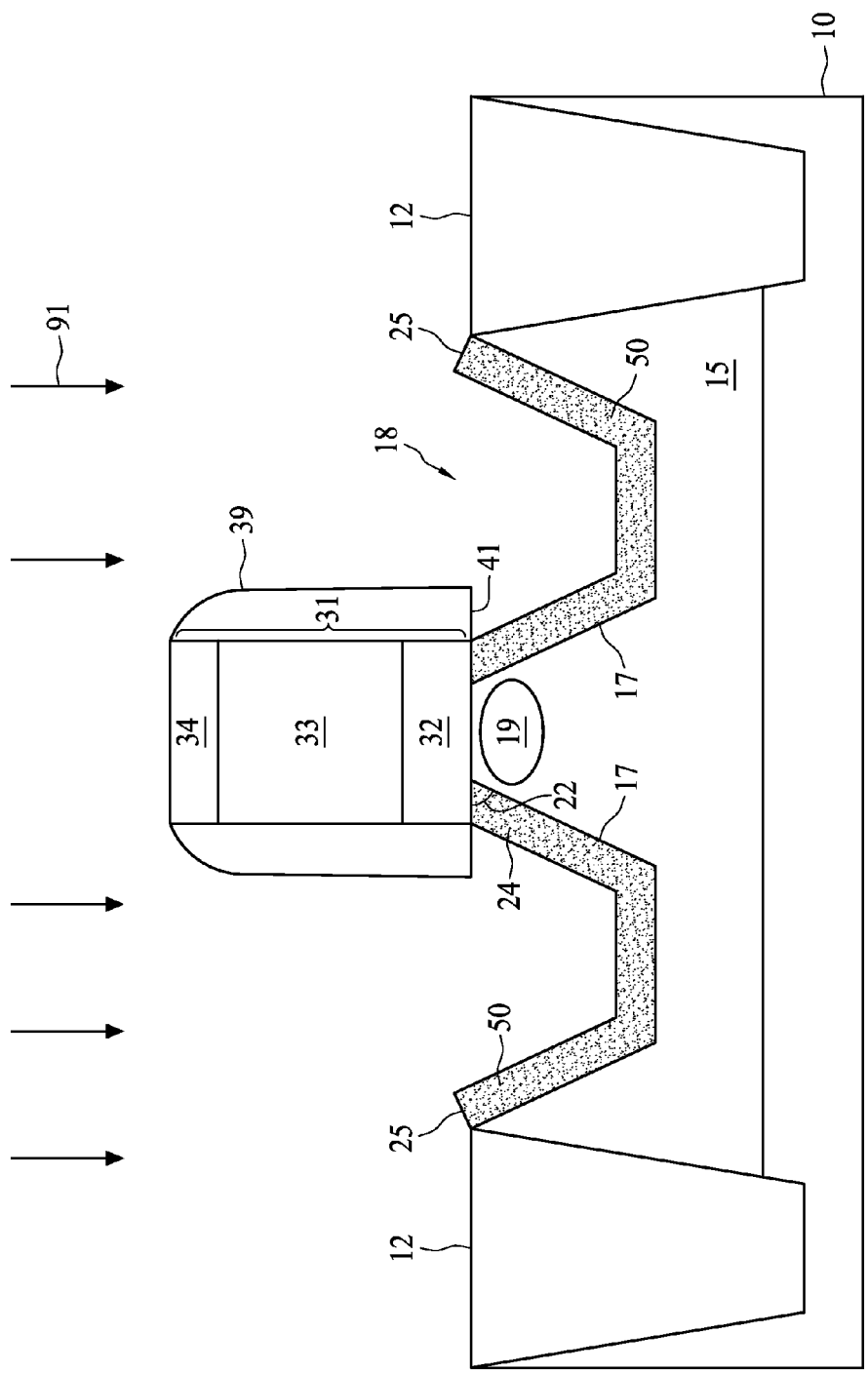

Referring to FIG. 1C, a deposition 91 is performed to selectively form a protection layer 50 in the cavity 18, wherein the protection layer 50 is lining the surface 17. The protection layer 50 includes a thickness in a range from about 10 Å to 35 Å. In an embodiment, the protection layer 50 includes a thickness in a range from about 15 Å to 50 Å. An end portion 24 of the protection layer 50 fills the corner 22, wherein the end portion 24 interfaces the bottom portion 41 and the channel region 19. An end portion 25 of the protection layer 50 interfaces with the isolations 12. As such, the protection layer 50 extends from the bottom portion 41 to the isolations 12. In an embodiment, the deposition 91 includes a precursor having, for example, a silicon-containing compound. The silicon-containing compound includes, but is not limited to, silane ($SiH_4$), disilane ($Si_2H_6$), trisilane ($Si_3H_8$), dichlorosilane ($SiH_2Cl_2$), and penta-chloro silane. Thus, the protection layer 50 is made of silicon. In addition, the deposition 91 includes specific temperature and pressure conditions to fabricate the protection layer 50 having an amorphous state, which refers to amorphous silicon herein. For example, the temperature range of the chamber lies in the range of 500 C to 600 C, which is lower than a temperature range for single crystalline silicon, wherein the composition of silane and a carrier gas such as hydrogen or nitrogen causes a formation of a thin amorphous silicon layer atop the substrate 10. During the formation of the amorphous silicon layer, impurities are not introduced into the chamber for the formation of a uniform and undoped protection layer 50 with an amorphous state. In comparison, the substrate 10 utilizes a wafer with various surface orientations, such as the lattice planes {010}, {100}, or {110}, whereas the protection layer 50 is implemented as an amorphous state. In an embodiment, the protection layer 50 is in-situ formed and transformed into an amorphous state. As such, the protection layer 50 has an atom stacking arrangement different from a single crystalline stacking of the substrate 10. A boundary line, which extends along the surface 17, between the protection layer 50 and the substrate 10 can be observed by microscope equipment; for example, a transmission electron microscope (TEM) or a scanning electron microscopy (SEM).

In an embodiment, the protection layer 50 includes, for example, silicon germanium (SiGe), silicon carbide (SiC), silicon phosphorus (SiP), or silicon phosphorus carbide (SiPC) with an amorphous state. Other exemplary materials of the protection layer 50 include germanium, gallium arsenide, gallium nitride, aluminum gallium indium phosphide, and/or other possible compositions. The protection layer 50 is also implemented as an undoped layer without n-type dopants or p-type dopants. In particular, the protection layer 50 includes an amorphous atom stacking arrangement, which is different from the single crystalline stacking of the substrate 10 or subsequent source/drain regions.

In an embodiment, the protection layer 50 is configured to be more resistant to a compound of chlorine or phosphor than the substrate 10. Since the material of the substrate 10 is subject to be etched by chlorine or phosphor, the protection layer 50 includes a material with a degree of lattice disorder, which is able to block the etchant gases from penetrating into the substrate 10. Further, the protection layer 50 still has semiconductive features so as not to isolate subsequent source/drain regions from the channel region 19.

In an embodiment, impurities are in-situ added to the protection layer 50 during the deposition 91. The protection layer 50 is doped in-situ with p-type or n-type dopants. The in-situ dopant is opposite to the polarity of the channel region 19 including, for example, boron, germanium, indium, phosphorous, arsenic, and/or antimony. Since the end portion 24 of the protection layer 50 fills the corner 22, the end portion 24 is closer to the channel region 19 than subsequent source/drain regions. The end portion 24 interfacing the channel region 19 can be regarded as extension source/drains, which are implemented as lightly doped (LDD), medium doped (MDD), or heavily doped (HDD) extension regions.

In an embodiment, the protection layer 50 is made of single crystalline silicon, wherein the protection layer 50 includes a crystal orientation different from a crystal orientation of the substrate 10. The substrate 10 is a single crystalline silicon matrix. For example, the substrate 10 utilizes a wafer with various surface orientations, such as the lattice planes {010}, {100}, or {110}, whereas the protection layer 50 includes a crystal orientation {111} of an inclined surface, such as the end portion 24. Since a subsequent epitaxial process for source/drain regions includes corrosive or etchant gases, the different orientation provides an etching selectivity during the subsequent epitaxial process. The protection layer 50 with a different orientation prevents the substrate 10 from being penetrated.

Figure 1D:
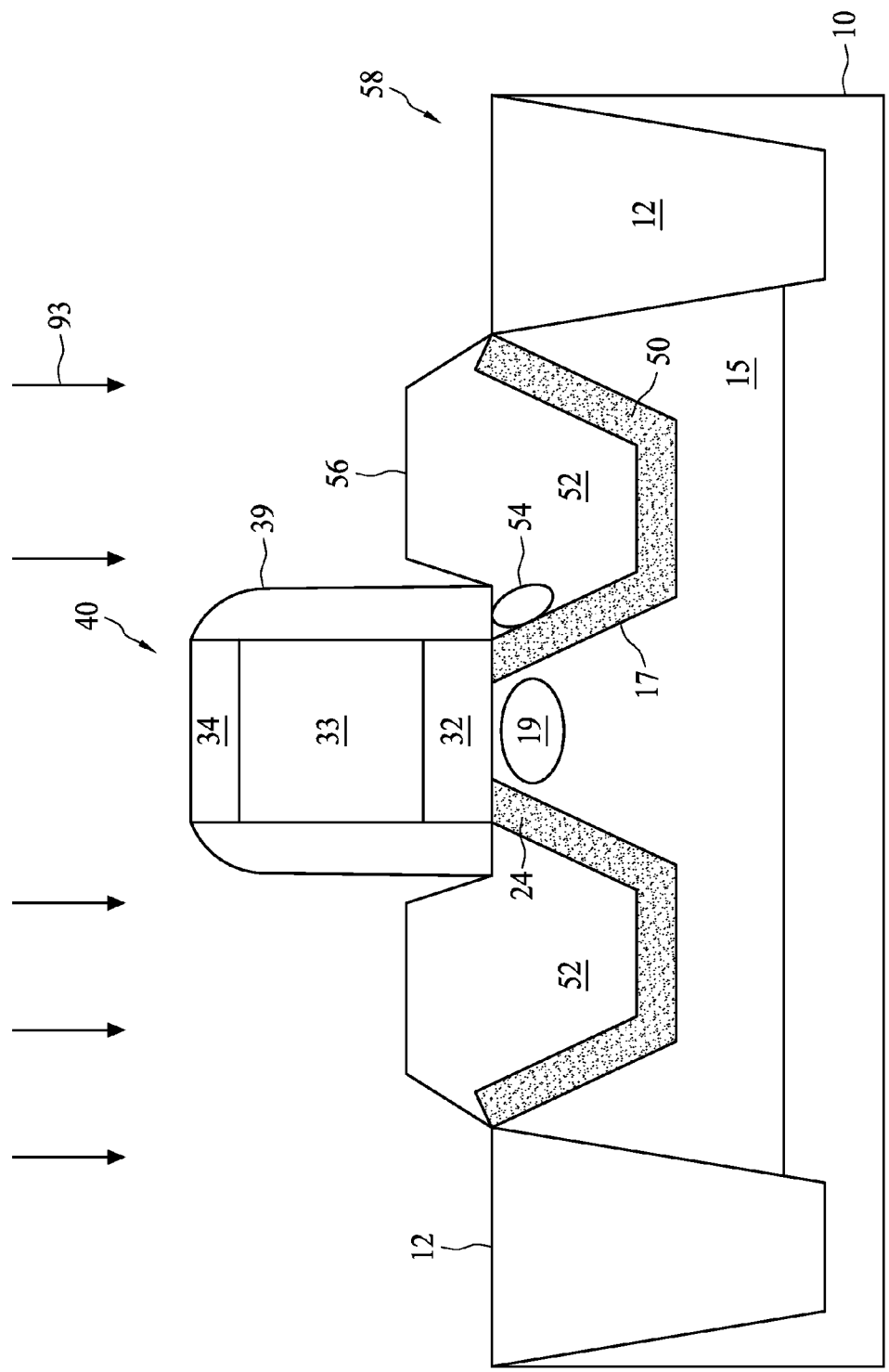

Referring to FIG. 1D, an epitaxial deposition 93 is performed to selectively form a raised source/drain region 52 on the protection layer 50. The raised source/drain region 52 fills up the cavity 18, wherein the raised source/drain region 52 includes at least one epitaxial grown layer. A bottommost epitaxial grown layer (not shown) interfaces with the protection layer 50. Further, the raised source/drain region 52 includes a tip region 54 under the gate structure 40, wherein the protection layer 50 is closer to the channel region 19 than the tip region 54. The protection layer 50 includes semiconductive features, instead of a dielectric layer, so that the end portion 24 will not isolate the raised source/drain region 52 from the channel region 19. The end portion 24 is also regarded as an extension source/drain region that is either doped or undoped. By forming the tip region 54 proximity to the channel region 19, a larger hydrostatic stress is induced on the channel region 19, resulting in higher carrier mobility and increased drive current. After the cavity 18 is filled up, the epitaxial deposition 93 continues to deposit so that a top surface 56 elevates from a surface 58 of the substrate 10. Further, the raised source/drain region 52 is doped in-situ with p-type or n-type dopants during the epitaxial deposition 93. During the epitaxial deposition 93, an amount of germanium gradually increases so as to form a gradient distribution. Alternatively, the dopant concentration of the epitaxial deposition 93 is constant in order to form a constant distribution.

In an embodiment, the epitaxial deposition 93 includes a precursor, for example, a silicon-containing compound, a phosphor-containing compound and a chlorine-containing compound. The silicon-containing compound includes, but is not limited to, silane ($SiH_4$), disilane ($Si_2H_6$), trisilane ($Si_3H_8$), dichlorosilane ($SiH_2Cl_2$), and penta-chloro silane. The phosphor-containing compound includes, for example, phosphine ($PH_3$). The chlorine-containing compound includes, for example, hydrochloric acid (HCl). As such, the raised source/drain region 52 includes silicon phosphorus (SiP), which provides strain to the channel region 19. Alternatively, the raised source/drain region 52 includes, for example, silicon carbide, single crystalline silicon or any single crystalline semiconductor material that can be epitaxial-grown. In comparison, the raised source/drain region 52 or the substrate 10 includes a single crystalline state, whereas the protection layer 50 includes an amorphous state. During the epitaxial deposition 93, an etchant gas or a corrosive gas is accompanied with deposited materials. The etchant gas is active and intended to penetrate into the substrate 10. In particular, when there are dislocations, pit holes or damages on the surface 17, the etchant gas has a high tendency to penetrate into the substrate 10. Since the protection layer 50 has an amorphous state, the protection layer 50 is able to block atoms of the corrosive gases or etchant gases, such as phosphine and chlorine. The protection layer 50 with an amorphous state has a higher degree of lattice disorder, wherein it is difficult for the atoms of the etchant gases to pass through the disorder stacking. In addition, the protection layer 50 seals the dislocations, pit holes or damages of the surface 17. As such, the etchant gas will not penetrate into the substrate 10 or invade unintentional positions in the substrate 10. The profile of the raised source/drain region 52 is effectively confined by the protection layer 50. By using the protection layer 50, yield and electrical performance are increased.

FIGS. 2A-2I represent a method of manufacturing a semiconductor device in accordance with some embodiments of the present disclosure. Each figure represents a stage of the method in a cross-sectional perspective view.

Figure 2A:
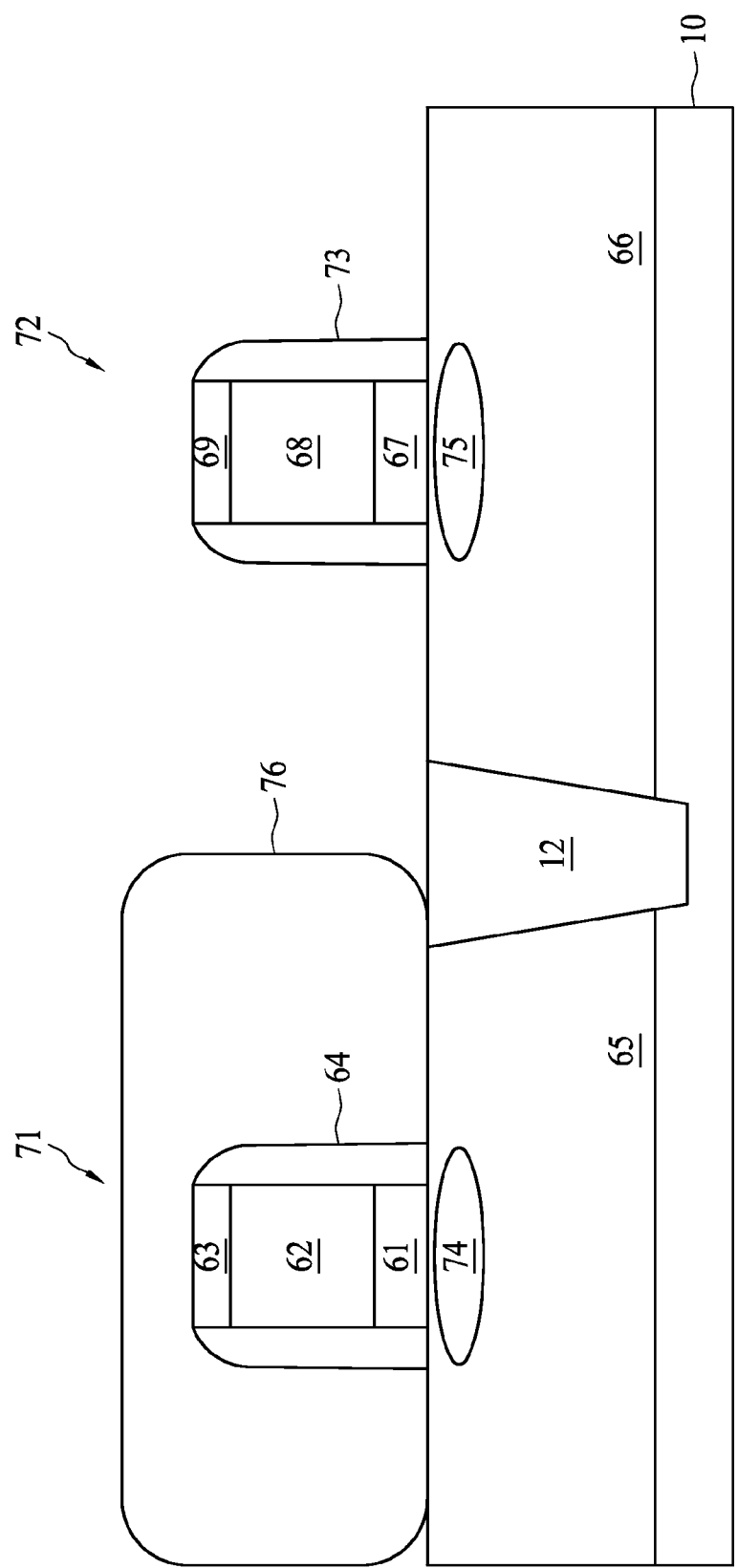
FIGS. 2A-2I represent a method of manufacturing a semiconductor device in accordance with some embodiments of the present disclosure.

Referring to FIG. 2A, a substrate 10 is provided, wherein the substrate 10 includes doped wells 65 and 66, and an isolation 12 located between the doped wells 65 and 66. The doped well 65 is implemented as a p-type well, whereas the doped well 66 is implemented as an n-type well. Gate structures 71 and 72 are formed on the substrate 10, wherein the gate structure 71 includes a gate dielectric 61, a gate electrode 62, a hard mask 63 and a sidewall spacer 64. The gate structure 72 includes a gate dielectric 67, a gate electrode 68, a hard mask 69 and a sidewall spacer 73. Channel regions 74 and 75 are respectively located under the gate structures 71 and 72. A photoresist is coated on the substrate and then patterned to form a patterned photoresist 76. The patterned photoresist 76 covers the gate structure 71 and the doped well 65. The gate structure 72 and the doped well 66 are exposed.

Figure 2B:
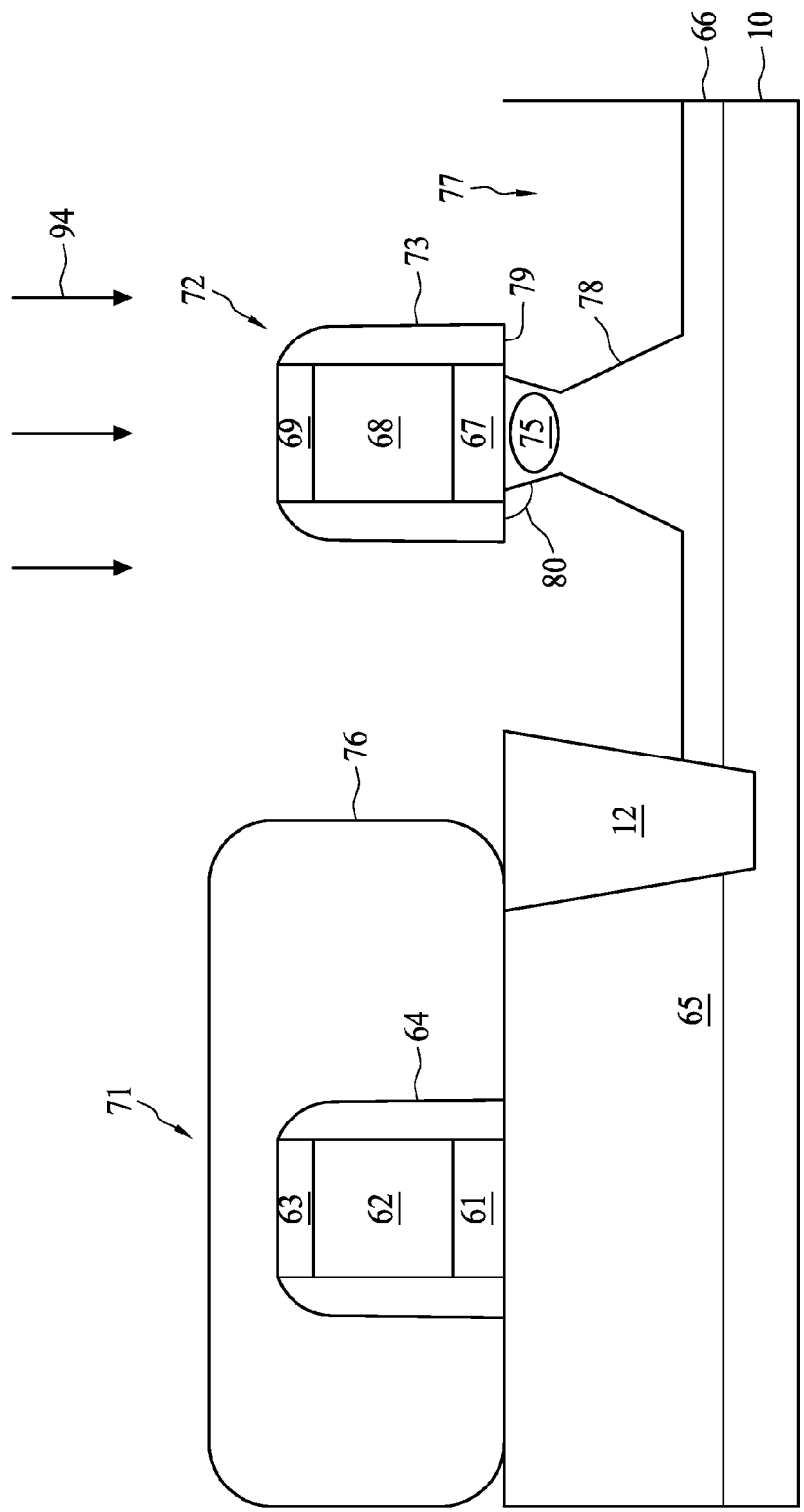

Referring to FIG. 2B, an etching process 94 is performed on the substrate 10 to form a cavity 77 in the doped well 66 and adjacent to the gate structure 72. During the etch process 94, the hard mask 69 and the sidewall spacer 73 serve as a mask so as to protect the channel region 75 and the gate electrode 68. The cavity 77 thus exposes a surface 78, wherein the surface 78 extends from a bottom portion 79 of the gate structure 72 to adjacent isolations. The surface 78 includes a U-shaped profile, a polygon profile or a rounded profile. The etching process 94 utilizes a wet etching or a dry etching with an isotropic feature that undercuts a portion of the substrate 10 under the gate structure 72. The semiconductor material under the gate structure 72 is encroached so as to form a corner 80 between the bottom portion 79 and the surface 78.

Figure 2C:
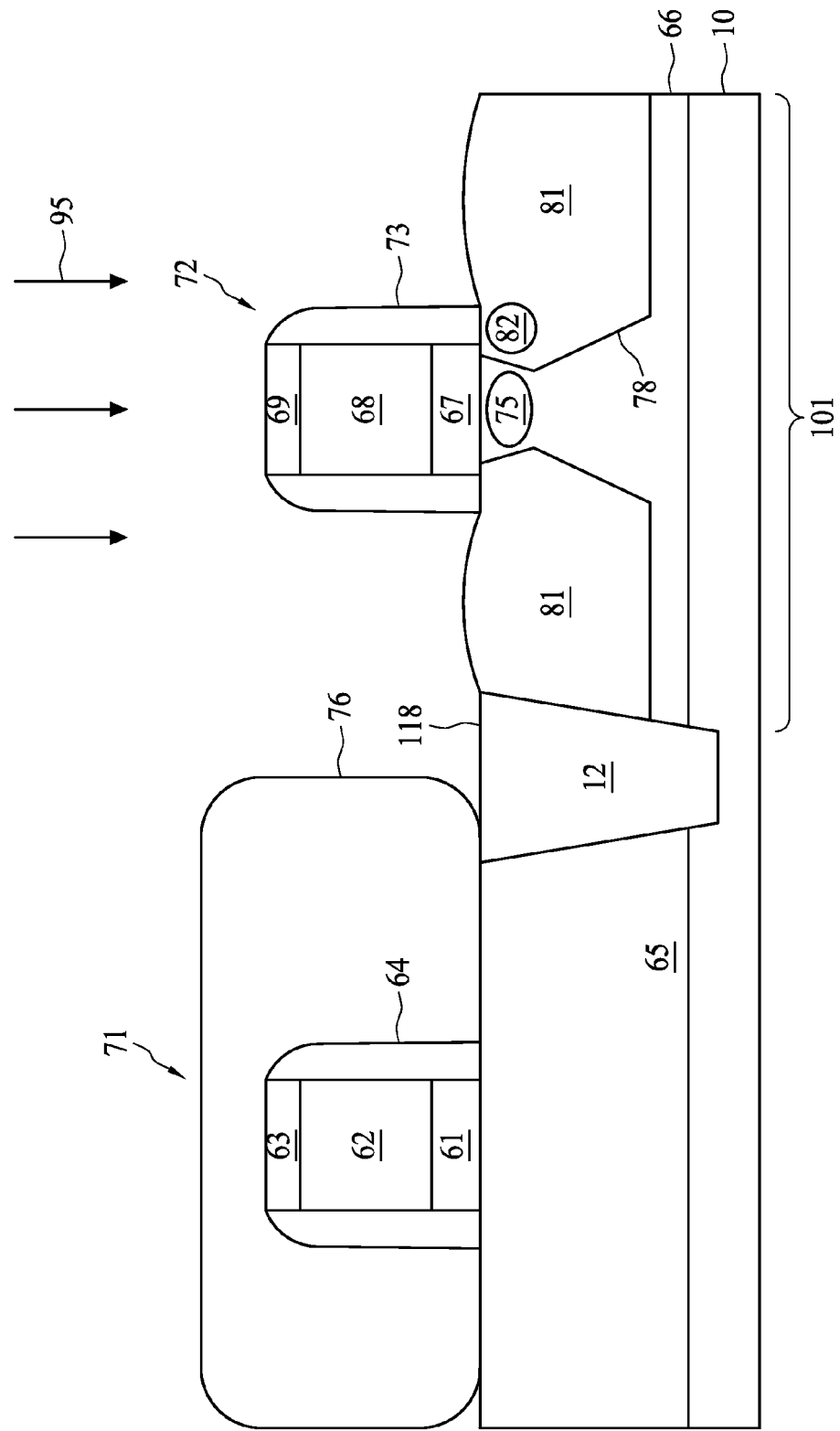

Referring to FIG. 2C, an epitaxial deposition 95 is performed to selectively form a source/drain region 81 within the cavity 77. The source/drain region 81 fills up the cavity 77 layer by layer, wherein the source/drain region 81 includes at least one epitaxial grown layer. The source/drain region 81 interfaces with the surface 78. Further, the source/drain region 81 includes a tip region 82 under the gate structure 72. By forming the tip region 82 proximity to the channel region 75, a larger hydrostatic stress is induced on the channel region 75, resulting in higher carrier mobility and increased drive current. The source/drain region 81 elevates slightly above a surface 118 of the substrate 10. In an embodiment, the epitaxial deposition 95 includes a precursor, for example, a silicon-containing compound, a germanium-containing compound and a dopant material. The silicon-containing compound includes, but is not limited to, silane ($SiH_4$), disilane ($Si_2H_6$), trisilane ($Si_3H_8$), dichlorosilane ($SiH_2Cl_2$), and penta-chloro silane. The germanium-containing compound includes, for example, germane ($GeH_4$). Thus, the source/drain region 81 includes silicon germanium, which provides strain to the channel region 75. Further, the source/drain region 81 is doped in-situ with p-type dopants during the epitaxial deposition 95. As such, the source/drain region 81 is implemented as a p-type source/drain region; and the channel region 75 is implemented as an n-type channel, thus forming a PMOS 101. Later, the patterned photoresist 76 is stripped by a solution or an ashing process.

Figure 2D:
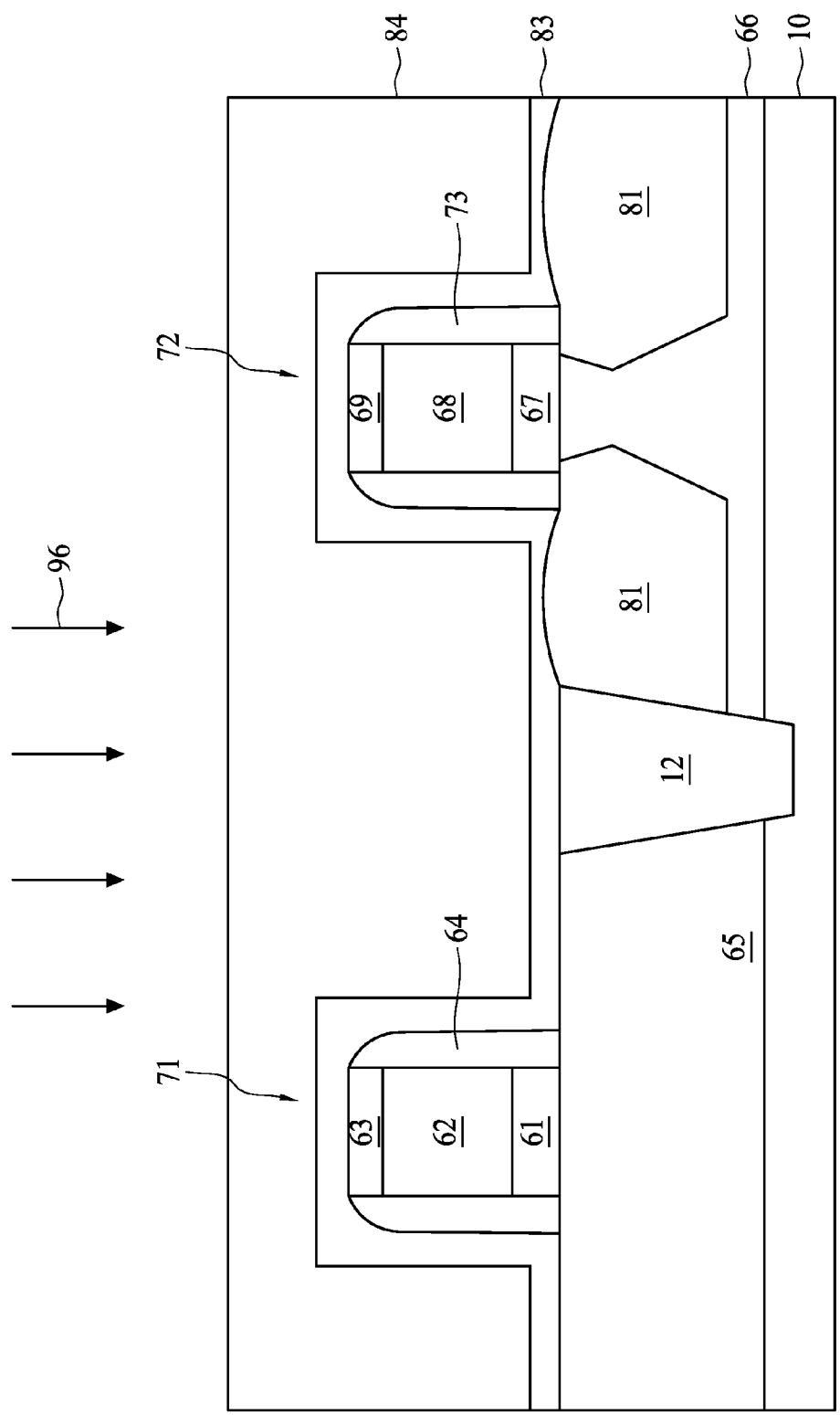

Referring to FIG. 2D, a capping layer 83 is deposited blanketly on the substrate 10 by a deposition 96, wherein the capping layer 83 is conformal to the gate structures 71 and 72. The capping layer 83 covers the hard masks (63, 69) and the sidewall spacers (64, 73). The deposition 96 includes a silicon-containing compound, a nitride-containing compound, or other impurities. For example, the deposition 96 has a precursor including $SiH_4$, $Si_2H_6$, $N_2O$, or $NH_3$, thus forming an oxynitride layer. The capping layer 83 is made of a dielectric material, for example, silicon oxide, silicon oxynitride, a stack of at least one silicon oxide and at least one silicon nitride, or any other suitable material. The capping layer 83 serves as an etch stop layer or a photoresist protection oxide in accordance with different materials. A photoresist 84 is then coated on the capping layer 83.

Figure 2E:
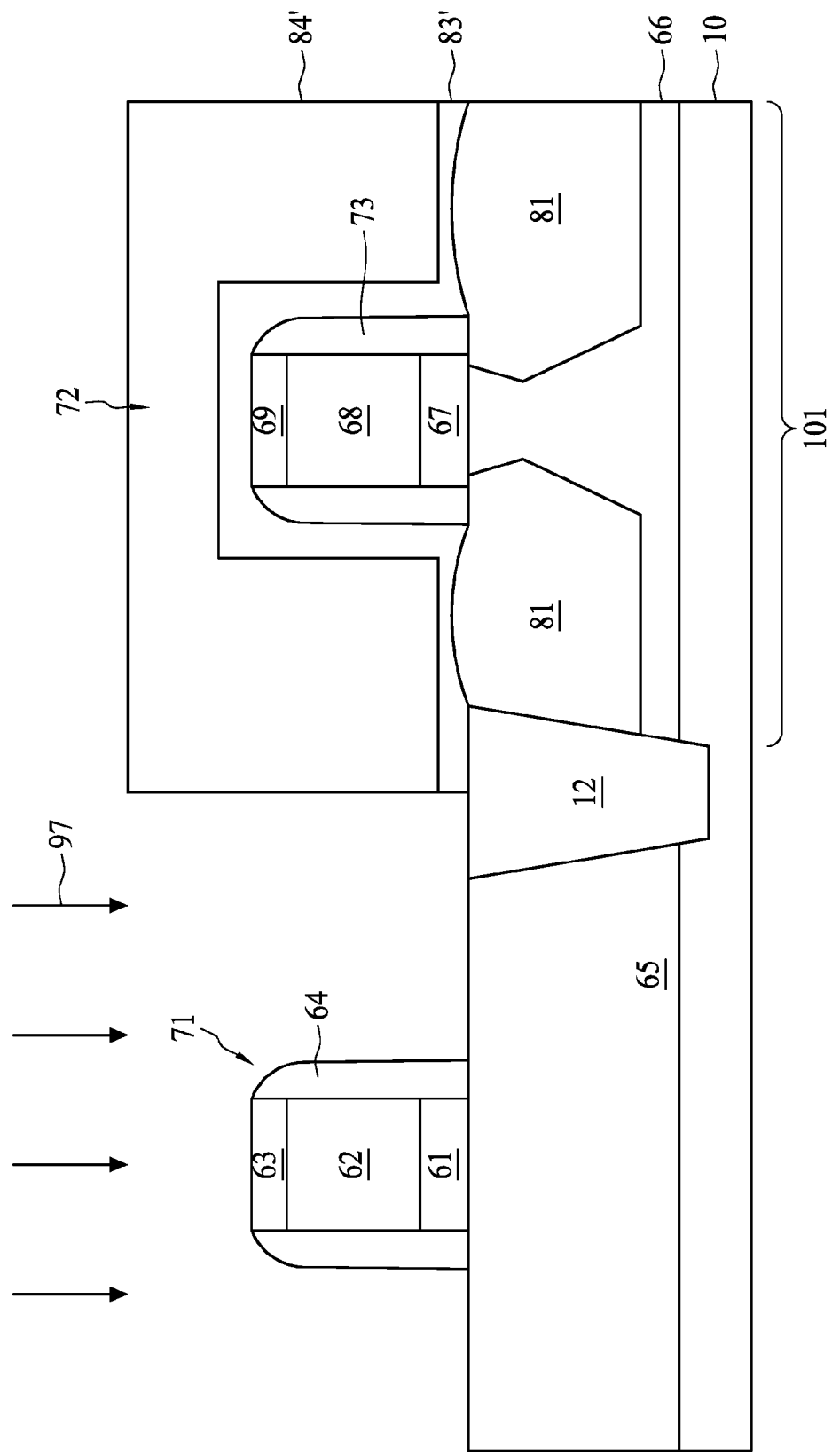

Referring to FIG. 2E, the photoresist 84 is then patterned to form a patterned photoresist 84'. The patterned photoresist 84' covers the PMOS 101, thus exposing the capping layer 83 over the gate structure 71 and the doped well 65. Later, an etching process 97 is performed to strip the capping layer 83 over the gate structure 71 and the doped well 65. As such, the gate structure 71 and the doped well 65 are exposed. A capping layer 83' and the patterned photoresist 84' remain on the PMOS 101. The etching process 97 includes an etchant gas or solution, which is able to react with the capping layer 83.

Figure 2F:
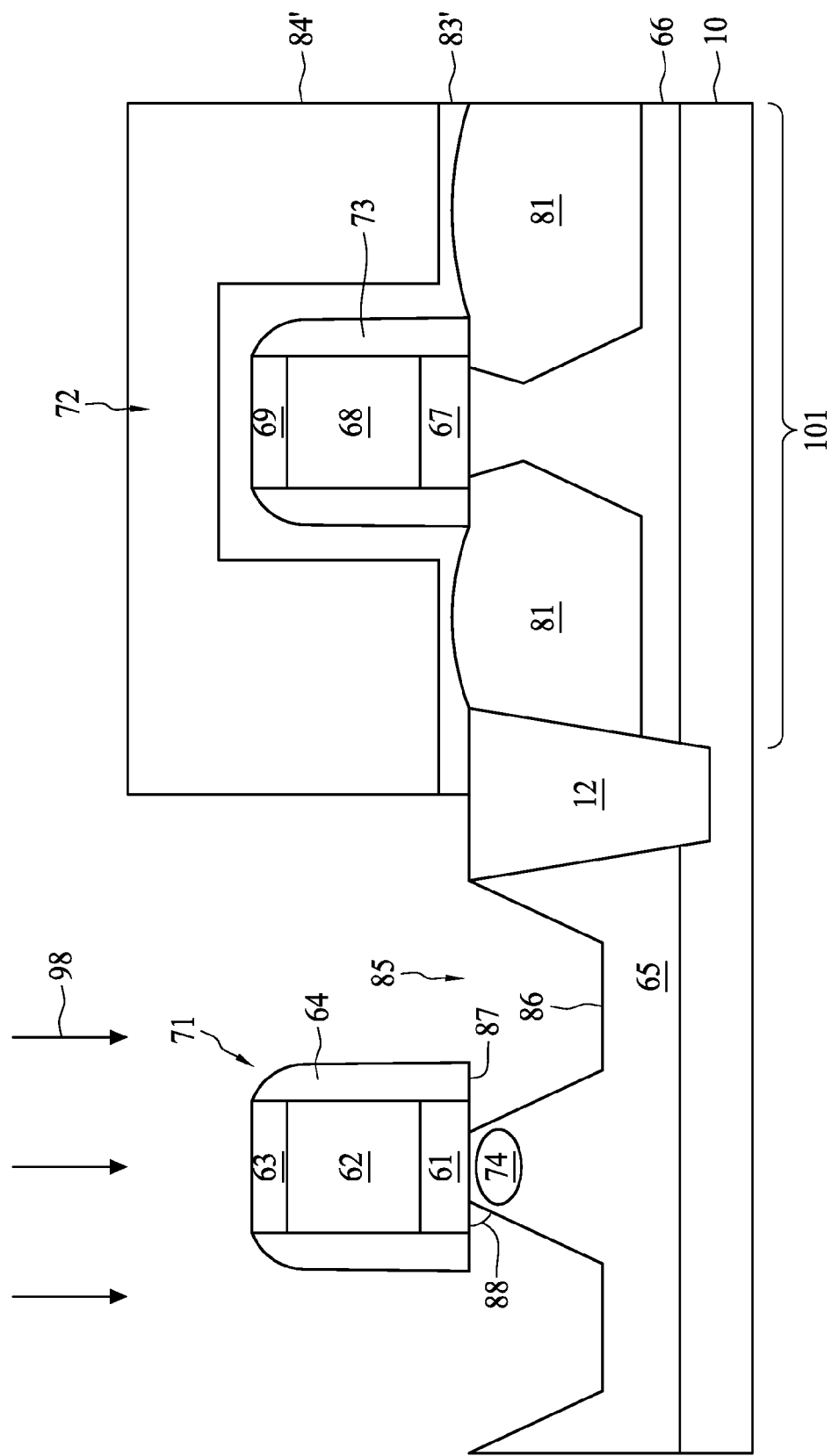

Referring to FIG. 2F, a cavity 85 is formed in the substrate 10 and adjacent to the gate structure 71 by using an etch process 98, wherein the gate structure 71 serves as a mask. Specifically, the hard mask 63 and the sidewall spacer 64 protect the channel region 74 and the gate electrode 62. The cavity 85 is vertically formed into the doped well 65 with a depth, for example, between about 10 nm and about 80 nm. The cavity 85 thus exposes a surface 86, wherein the surface 86 extends from a bottom portion 87 of the gate structure 71 to the isolation 12. The surface 86 includes a U-shaped profile, a polygon profile or a rounded profile. The cavity 85 further includes a corner 88 under the gate structure 71, wherein the corner 88 exposes the bottom portion 87. In an embodiment, the etching process 98 is a wet etching or a dry etching with an isotropic feature that undercuts a portion of the substrate 10 under the gate structure 71. The semiconductor material under the gate structure 71 is encroached so as to form the corner 88 between the bottom portion 87 and the surface 86.

Figure 2G:
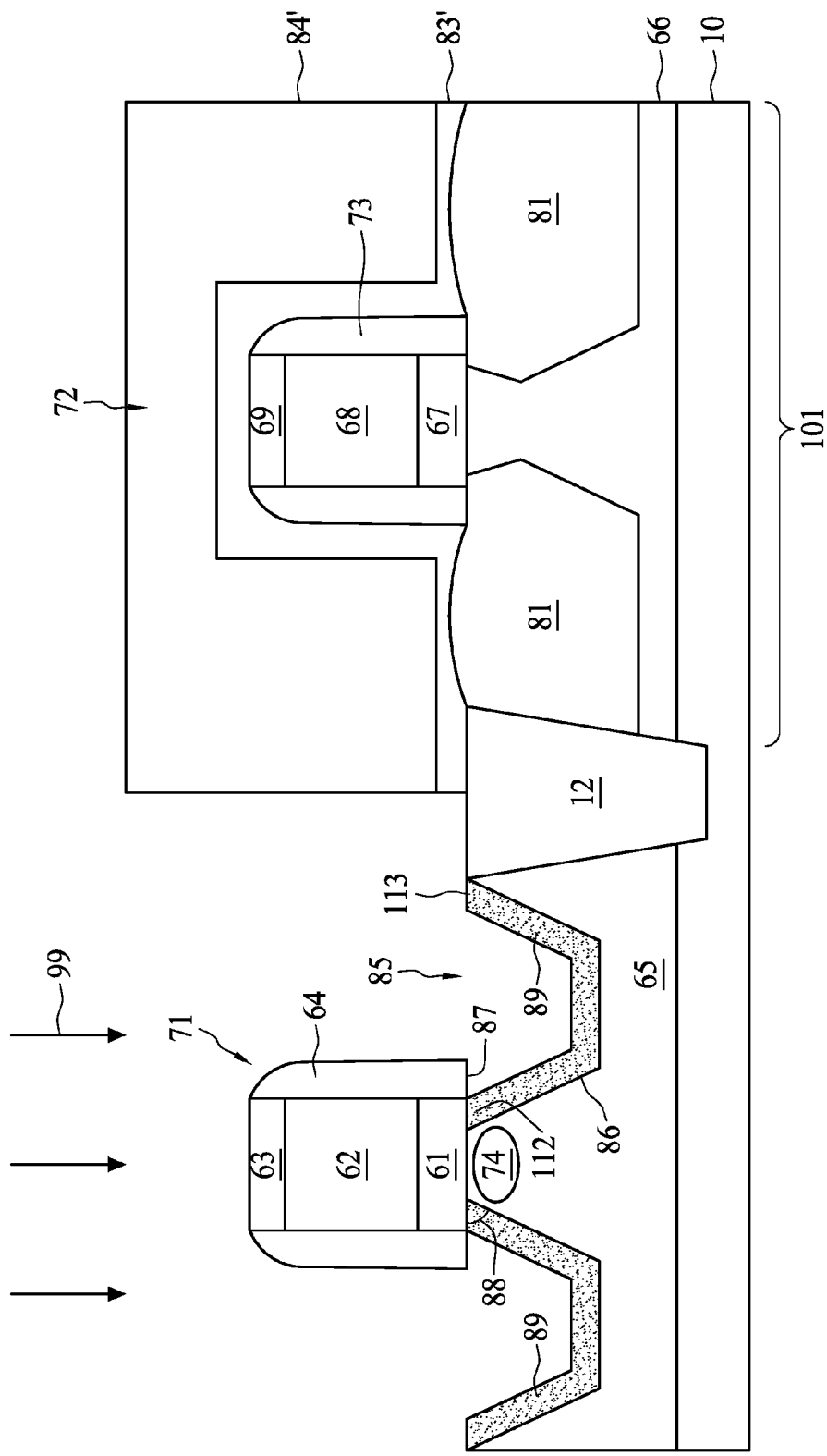

Referring to FIG. 2G, a deposition 99 is performed to selectively form a non-crystallized layer 89 on the surface 86. An end portion 112 of the non-crystallized layer 89 fills the corner 88, wherein the end portion 112 interfaces the bottom portion 87 and the channel region 74. An end portion 113 of the non-crystallized layer 89 interfaces with the isolations 12. As such, the non-crystallized layer 89 extends from the bottom portion 87 to the isolations 12. In an embodiment, the deposition 99 includes a precursor having, for example, a silicon-containing compound. The silicon-containing compound includes, but is not limited to, silane ($SiH_4$), disilane ($Si_2H_6$), trisilane ($Si_3H_8$), dichlorosilane ($SiH_2Cl_2$), and penta-chloro silane. Thus, the non-crystallized layer 89 is made of silicon. That is, the non-crystallized layer 89 includes a semiconductor material species that is the same as that of the substrate 10. The non-crystallized layer 89 is also an undoped silicon layer. In addition, the deposition 99 includes specific temperature and pressure conditions to fabricate the non-crystallized layer 89 having an amorphous state, which refers to amorphous silicon herein. In particular, the non-crystallized layer 89 has an atom stacking arrangement different from a single crystalline stacking of the substrate 10. A boundary line, which extends along the surface 86, between the non-crystallized layer 89 and the substrate 10 can be observed by microscope equipment, for example, a transmission electron microscope (TEM) or a scanning electron microscopy (SEM).

Alternatively, the non-crystallized layer 89 includes a material suitable for NMOS's source/drain regions, for example, silicon phosphorus (SiP) or silicon phosphorus carbide (SiPC) with an amorphous state. The non-crystallized layer 89 is doped in-situ with n-type dopants. Since the end portion 112 of the non-crystallized layer 89 fills the corner 88, the end portion 112 is closer to the channel region 74 than subsequent source/drain regions. The end portion 112 interfacing the channel region 74 can be regarded as extension source/drains, which are implemented as lightly doped drains (LDD). The non-crystallized layer 89 includes a dopant concentration lower than that of a subsequent source/drain region. In particular, the non-crystallized layer 89 includes an amorphous atom stacking arrangement, which is different from the atom stacking arrangement of the substrate 10 or subsequent source/drain regions.

Figure 2H:
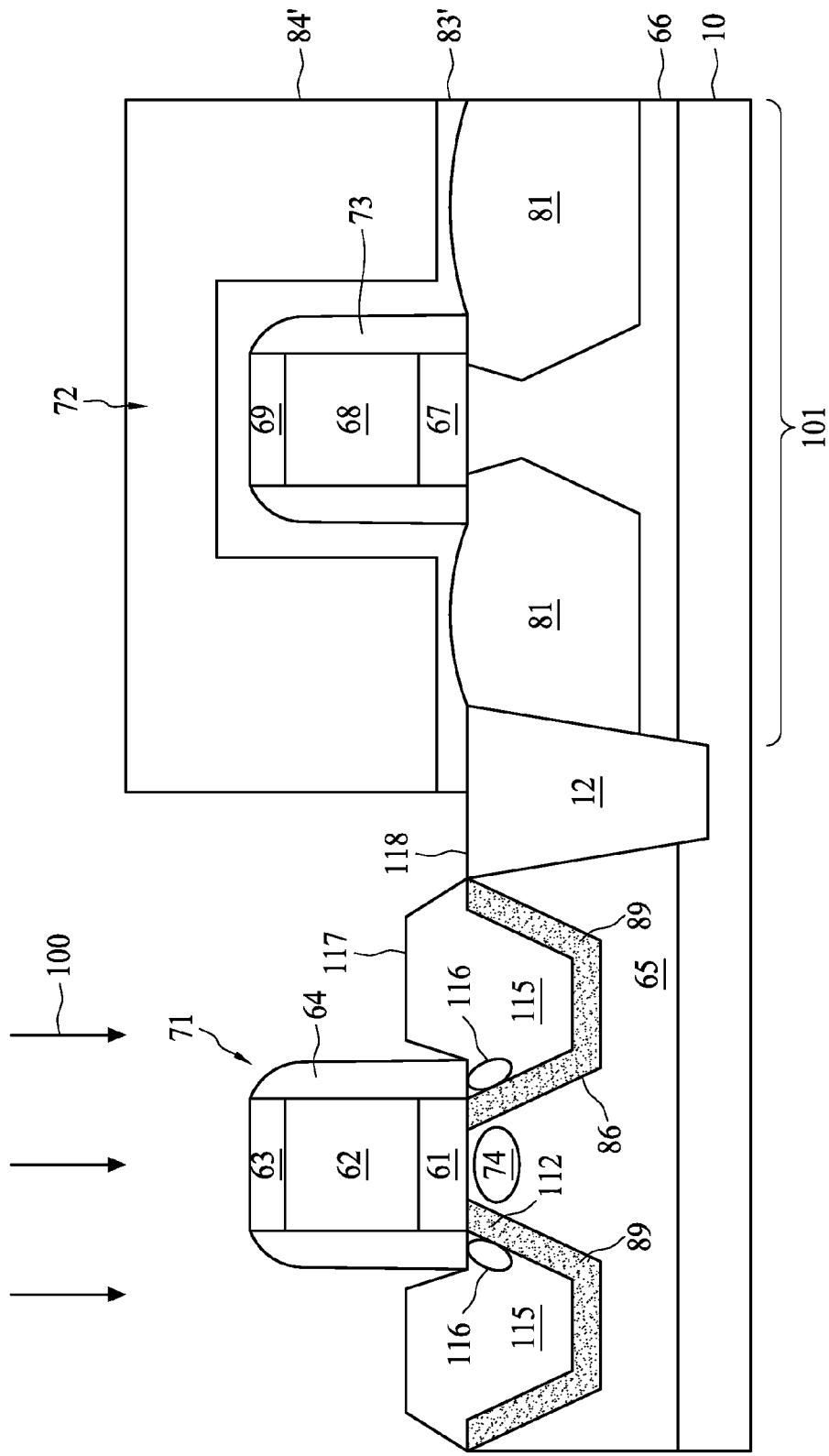

Referring to FIG. 2H, an epitaxial deposition 100 is performed to selectively form a raised source/drain region 115 on the non-crystallized layer 89. The raised source/drain region 115 fills up the cavity 85, wherein the raised source/drain region 115 includes at least one epitaxial grown layer. Further, the raised source/drain region 115 includes a tip region 116 under the gate structure 71, wherein an end portion 112 of the non-crystallized layer 89 is closer to the channel region 74 than the tip region 116. The non-crystallized layer 89 includes semiconductive features, instead of a dielectric layer, so that the end portion 112 will not isolate the raised source/drain region 115 from the channel region 74. The raised source/drain region 115 includes a top surface 117 elevated from a surface 118 of the substrate 10.

In an embodiment, the epitaxial deposition 100 includes a precursor, for example, a silicon-containing compound, a phosphor-containing compound and a chlorine-containing compound. The phosphor-containing compound includes, for example, phosphine ($PH_3$). The chlorine-containing compound includes, for example, hydrochloric acid (HCl). As such, the raised source/drain region 115 includes silicon phosphorus (SiP), which provides strain to the channel region 74. During the epitaxial deposition 100, an etchant gas or a corrosive gas is accompanied with deposited materials. The etchant gas is active and intended to penetrate into the substrate 10. In particular, when there are dislocations, pit holes or damages on the surface 86, the etchant gas has a high tendency to penetrate into the substrate 10. Since the non-crystallized layer 89 has an amorphous state, the non-crystallized layer 89 is able to block atoms of the corrosive gases or etchant gases, such as phosphine and chlorine. The non-crystallized layer 89 with an amorphous state has a higher degree of lattice disorder, wherein it is difficult for the atoms of the etchant gases to pass through the non-crystallized layer 89. In addition, the non-crystallized layer 89 seals the dislocations, pit holes or damages of the surface 86. As such, the etchant gas will not penetrate into the substrate 10 or invade unintentional positions in the substrate 10. The profile of the raised source/drain region 115 is effectively confined by the non-crystallized layer 89. By using the non-crystallized layer 89, yield and electrical performance are increased. Later, the capping layer 83' and the patterned photoresist 84' are removed by etching processes.

Figure 2I:
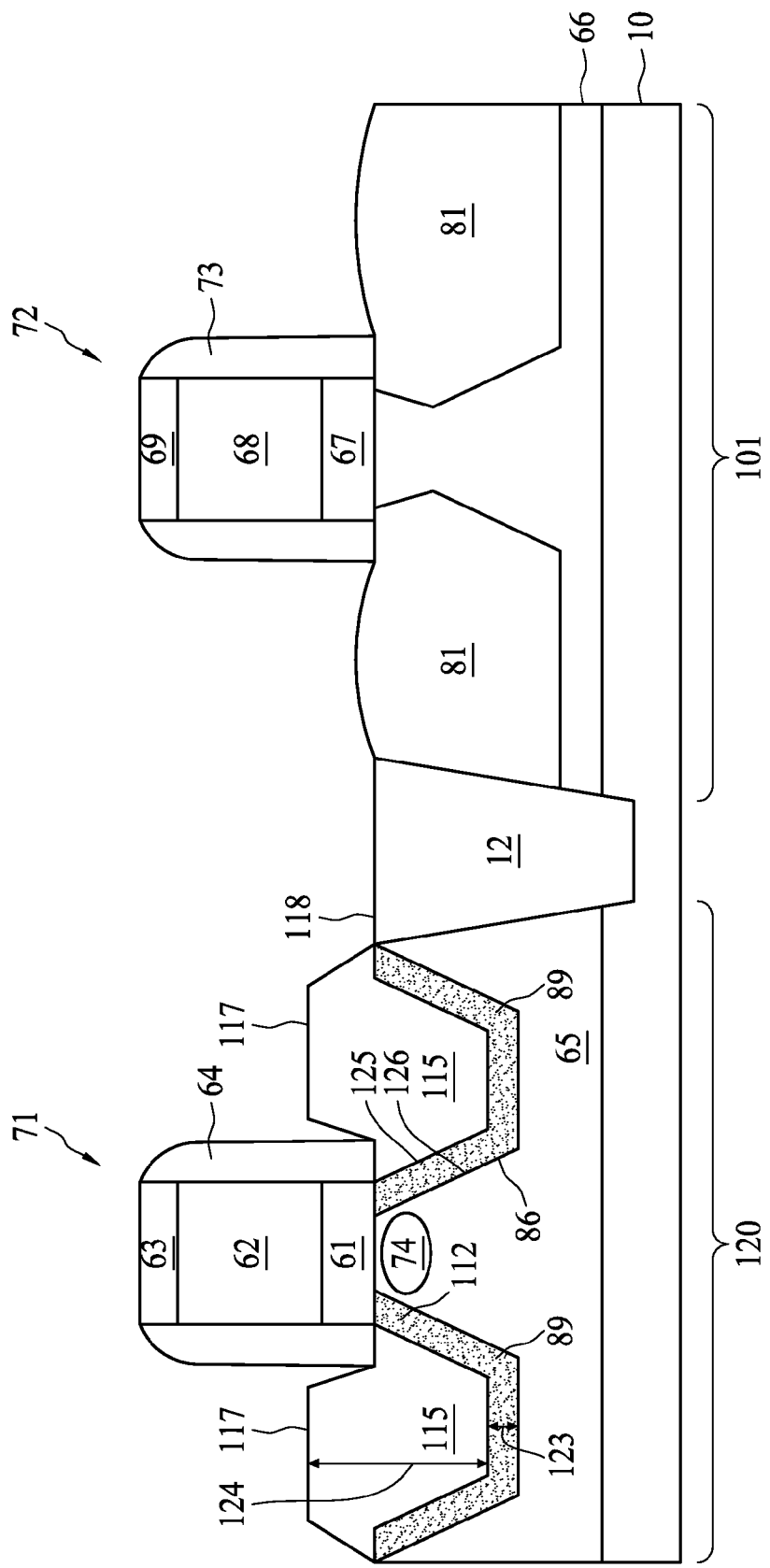

Referring to FIG. 2I, a NMOS 120 and a PMOS 101 are formed on the substrate 10. The substrate 10 and the raised source/drain region 115 include a single crystalline atom stacking, whereas the non-crystallized layer 89 includes an amorphous state or a non-crystallized state. The non-crystallized layer 89 is interposed between the substrate 10 and the raised source/drain region 115. The non-crystallized layer 89 includes a first surface 125 interfacing with the raised source/drain region 115; and a second surface 126 opposite to the first surface 125. The second surface 126 interfaces the substrate 10. The non-crystallized layer 89 includes a thickness 123 in a range about 0.1% to 10% of a thickness 124 of the raised source/drain region 115. The thickness 124 is measured from the top surface 117 to a bottommost portion of the raised source/drain region 115. The PMOS 101 does not include a non-crystallized layer or protection layer since the raised source/drain region 115 includes a semiconductor compound with an atomic diameter smaller than a semiconductor compound of the source/drain region 81 of the PMOS 101. For example, the raised source/drain region 115 has phosphorus atoms, whereas the source/drain region 81 has germanium atoms. Since the germanium atoms are bigger, it is difficult for the germanium atoms to penetrate into the substrate 10. Atoms with smaller atomic diameters, such as that of phosphorus atoms, have a higher tendency to penetrate into the substrate 10. The non-crystallized layer 89 effectively blocks the smaller atoms during the formation of the raised source/drain region 115.

In brief, a non-crystallized layer or a protection layer is interposed between a substrate and a source/drain region. The protection layer repairs pit holes, dislocations or dangling bonds of a surface of the substrate before forming the source/drain region. During the source/drain deposition, since the source/drain deposition includes corrosive gases or etchant gases, atoms of the etchant gases easily penetrate into the substrate. The protection layer stops the etchant gases so as to avoid formation of the source/drain materials at unintentional locations. Profiles of the source/drain regions match with the predetermined profiles and are not altered. As such, yield and electrical performance can be improved.

A semiconductor device includes: a gate structure on a substrate; a raised source/drain region adjacent to the gate structure; a channel region under the gate structure; and a protection layer between the substrate and the raised source/drain region. The protection layer is interposed between the substrate and the raised source/drain region. An atom stacking arrangement of the protection layer is different from the substrate and the raised source/drain region.

In some embodiments, the atom stacking arrangement of the protection layer is amorphous.

In some embodiments, the protection layer includes amorphous silicon.

In some embodiments, the substrate is a single crystalline silicon matrix.

In some embodiments, the raised source/drain region includes at least one epitaxial grown layer interfacing the protection layer.

In some embodiments, the protection layer is configured to be more resistant to a compound of chlorine or phosphor than the substrate.

In some embodiments, the protection layer is an undoped semiconductor layer.

In some embodiments, the protection layer includes an end portion interfacing a bottom of the gate structure and the channel region.

In some embodiments, the protection layer includes an end portion interfacing an isolation adjacent to the raised source/drain region.

In some embodiments, the raised source/drain region includes a tip region under the gate structure, and the protection layer is closer to the channel region than the tip region.

In some embodiments, the substrate includes a crystal orientation that is different from a crystal orientation of the protection layer.

A semiconductor device includes an N-type metal oxide semiconductor (NMOS) region; and a P-type metal oxide semiconductor (PMOS) region located adjacent to the NMOS region. The NMOS region includes a first gate structure on a substrate; a crystallized source/drain region adjacent to the first gate structure; and a non-crystallized layer interposed between the substrate and the crystallized source/drain region. The substrate includes a crystallized semiconductor material. The non-crystallized layer includes a first surface interfacing with the crystallized source/drain region; and a second surface opposite to the first surface. The second surface interfaces with the substrate. The PMOS region includes a second gate structure on the substrate; and a source/drain region adjacent to the second gate structure, wherein the source/drain region interfaces the substrate.

In some embodiments, the non-crystallized layer includes an amorphous state.

In some embodiments, the non-crystallized layer includes a semiconductor material species that is the same as that of the substrate.

In some embodiments, the non-crystallized layer includes a thickness in a range about 0.1% to 10% of a thickness of the crystallized source/drain region.

In some embodiments, the crystallized source/drain region includes a semiconductor compound with an atomic diameter smaller than a semiconductor compound of the source/drain region of the PMOS region.

In some embodiments, the non-crystallized layer includes a dopant concentration lower than that of the crystallized source/drain region.

A method for manufacturing a semiconductor device includes: providing a substrate, wherein a gate structure is formed on the substrate; forming a cavity in the substrate and adjacent to the gate structure; forming a protection layer in the cavity so as to be lining the cavity; and epitaxially growing a semiconductor material to fill the cavity by an epitaxial deposition process.

In some embodiments, the epitaxial deposition process includes a precursor including an etchant gas, and the etchant gas is blocked by the protection layer.

In some embodiments, the protection layer is in-situ formed and transformed into an amorphous state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure on a substrate, the gate structure comprising:
      a gate dielectric layer, disposed on the substrate;
   a raised source/drain region adjacent to the gate structure, the raised source/drain region comprising a tip region under the gate structure;
   a channel region under gate dielectric layer of the gate structure; and
   a protection layer, wherein:
      the protection layer is interposed between the substrate and the raised source/drain region, and
      an atom stacking arrangement of the protection layer is different from the substrate and the raised source/drain region, and the atom stacking arrangement of the protection layer is an amorphous state having a higher degree of lattice disorder than that of the substrate and the raised source/drain region, and the protection layer has a first end portion with the amorphous state formed between the tip region under the gate structure and the channel region under the gate dielectric layer.

2. The semiconductor device of claim 1, wherein the protection layer includes amorphous silicon.

3. The semiconductor device of claim 1, wherein the substrate is a single crystalline silicon matrix.

4. The semiconductor device of claim 1, wherein the raised source/drain region comprises at least one epitaxial grown layer interfacing the protection layer.

5. The semiconductor device of claim 1, wherein the protection layer is configured to be more resistant to a compound of chlorine or phosphor than the substrate.

6. The semiconductor device of claim 1, wherein the protection layer is an undoped semiconductor layer.

7. The semiconductor device of claim 1, wherein the protection layer comprises a second end portion at least coplanar with a top surface of an isolation adjacent to the raised source/drain region.

8. The semiconductor device of claim 1, wherein the raised source/drain region comprises a tip region under the gate structure, and the protection layer is closer to the channel region than the tip region.

9. The semiconductor device of claim 1, wherein the substrate comprises a crystal orientation that is different from a crystal orientation of the protection layer.

10. A semiconductor device, comprising:
an N-type metal oxide semiconductor (NMOS) region, including:
a first gate structure on a substrate, wherein the first gate structure comprises a gate dielectric layer disposed on the substrate, and the substrate includes a crystallized semiconductor material;
a channel region under gate dielectric layer of the first gate structure;
a crystallized source/drain region adjacent to the first gate structure, the crystallized source/drain region comprising a tip region under the first gate structure; and
a non-crystallized layer interposed between the substrate and the crystallized source/drain region, wherein the non-crystallized layer includes:
a first surface interfacing with the crystallized source/drain region; and
a second surface opposite to the first surface, wherein the second surface interfaces with the substrate, and the non-crystallized layer is an amorphous state having a higher degree of lattice disorder than that of the substrate and the crystallized source/drain region, and the non-crystallized layer has an end portion with the amorphous state formed between the tip region under the first gate structure and the channel region under the gate dielectric layer;
a P-type metal oxide semiconductor (PMOS) region located adjacent to the NMOS region, including:
a second gate structure on the substrate; and
a source/drain region adjacent to the second gate structure, wherein the source/drain region interfaces the substrate.

11. The semiconductor device of claim 10, wherein the non-crystallized layer comprises a semiconductor material species that is the same as that of the substrate.

12. The semiconductor device of claim 10, wherein the non-crystallized layer comprises a thickness in a range about 0.1% to 10% of a thickness of the crystallized source/drain region.

13. The semiconductor device of claim 10, wherein the crystallized source/drain region comprises a semiconductor compound with an atomic diameter smaller than a semiconductor compound of the source/drain region of the PMOS region.

14. The semiconductor device of claim 10, wherein the non-crystallized layer comprises a dopant concentration lower than that of the crystallized source/drain region.

15. A method for manufacturing a semiconductor device comprising:
providing a substrate, wherein a gate structure is formed on the substrate, and the gate structure comprises a gate dielectric layer disposed on the substrate, and;
forming a channel region under the gate dielectric layer;
forming a cavity in the substrate and adjacent to the gate structure;
forming a protection layer in the cavity so as to be lining the cavity; and
epitaxially growing a semiconductor material to fill the cavity to form a source/drain region by an epitaxial deposition process, wherein the source/drain region comprises a tip region under the gate structure;
wherein an atom stacking arrangement of the protection layer is amorphous state having a higher degree of lattice disorder than that of the substrate and that of the tip region, and the protection layer has an end portion with the amorphous state formed between the tip region under the gate structure and the channel region under the gate dielectric layer in contact with the gate dielectric layer.

16. The method of claim 15, wherein the epitaxial deposition process comprises a precursor including an etchant gas, and the etchant gas is blocked by the protection layer.

17. The method of claim 15, wherein the protection layer is in-situ formed and transformed into the amorphous state.

* * * * *